United States Patent [19]

Carteau

[11] Patent Number: 5,386,535
[45] Date of Patent: Jan. 31, 1995

[54] PROTECTED ELECTRONIC MASS MEMORY UNIT INCLUDING FIRST AND SECOND BUSES OF THE PARALLEL TYPE

[75] Inventor: Daniel Carteau, Montigny le Bretonneux, France

[73] Assignee: Bull, S.A., Paris, France

[21] Appl. No.: 620,471

[22] Filed: Nov. 30, 1990

[30] Foreign Application Priority Data

Dec. 1, 1989 [FR] France ................... 89 15914

[51] Int. Cl.⁶ .............................................. G06F 12/02
[52] U.S. Cl. .................. 395/425; 364/DIG. 1; 364/243.5; 364/243.1
[58] Field of Search ... 364/200 MS File, 900 MS File; 395/400, 425

[56] References Cited

U.S. PATENT DOCUMENTS

| | | | |
|---|---|---|---|
| 4,237,546 | 12/1980 | Wells | 395/800 |
| 4,507,730 | 3/1985 | Johnson et al. | 395/425 |
| 4,811,281 | 3/1989 | Okamoto et al. | 379/67.84 |
| 4,813,014 | 3/1989 | DeBell | 365/45 |
| 4,893,279 | 1/1990 | Rahman et al. | 365/230.03 |
| 4,999,620 | 3/1991 | Ishii | 345/188 |

FOREIGN PATENT DOCUMENTS 080875 11/1982 European Pat. Off. .

OTHER PUBLICATIONS

IBM Technical Disclosure, vol. 26, No. 4, Sep. 1983, pp. 1855–1857 "Electronic Diskette Unit".
Fujitsu Scientific & Technical Journal, vol. 21, No. 4, Sep. 1985, pp. 452–260, "High Density Packaging".
IEEE Micro, vol. 6, No. 1, Feb. 1986, pp. 7–15.
Electronic Comp. & Appl., vol. 6, No. 3, 1984, pp. 178–185.
IBM Technical Disclosure Bulletin, vol. 29, No. 5, Oct. 1986, pp. 2102–2107.

*Primary Examiner*—Joseph L. Dixon
*Assistant Examiner*—Hiep T. Nguyen
*Attorney, Agent, or Firm*—Kerkam, Stowell, Kondracki & Clarke

[57] ABSTRACT

A dual-access protected electronic mass memory unit, the various elements of which comprise a plurality of logic boards connected to at least one peripheral controller ($CNT_1$, $CNT_2$) of the information processing system (H) to which the unit belongs. The electronic memory unit includes at least one electronic disk unit ($DEI_1$, $DEI_2$) including a motherboard (11, 21) containing the corresponding controller ($CNT_1$, $CNT_2$), and a plurality of daughter boards (12-13, 22-23) comprising an equal number of memory planes connected among one another two-by-two, the first of them being connected to the motherboard. The central processor and the electronic disk unit are connected by the motherboard to a first and second parallel bus ($B_1$, $B_2$).

20 Claims, 6 Drawing Sheets

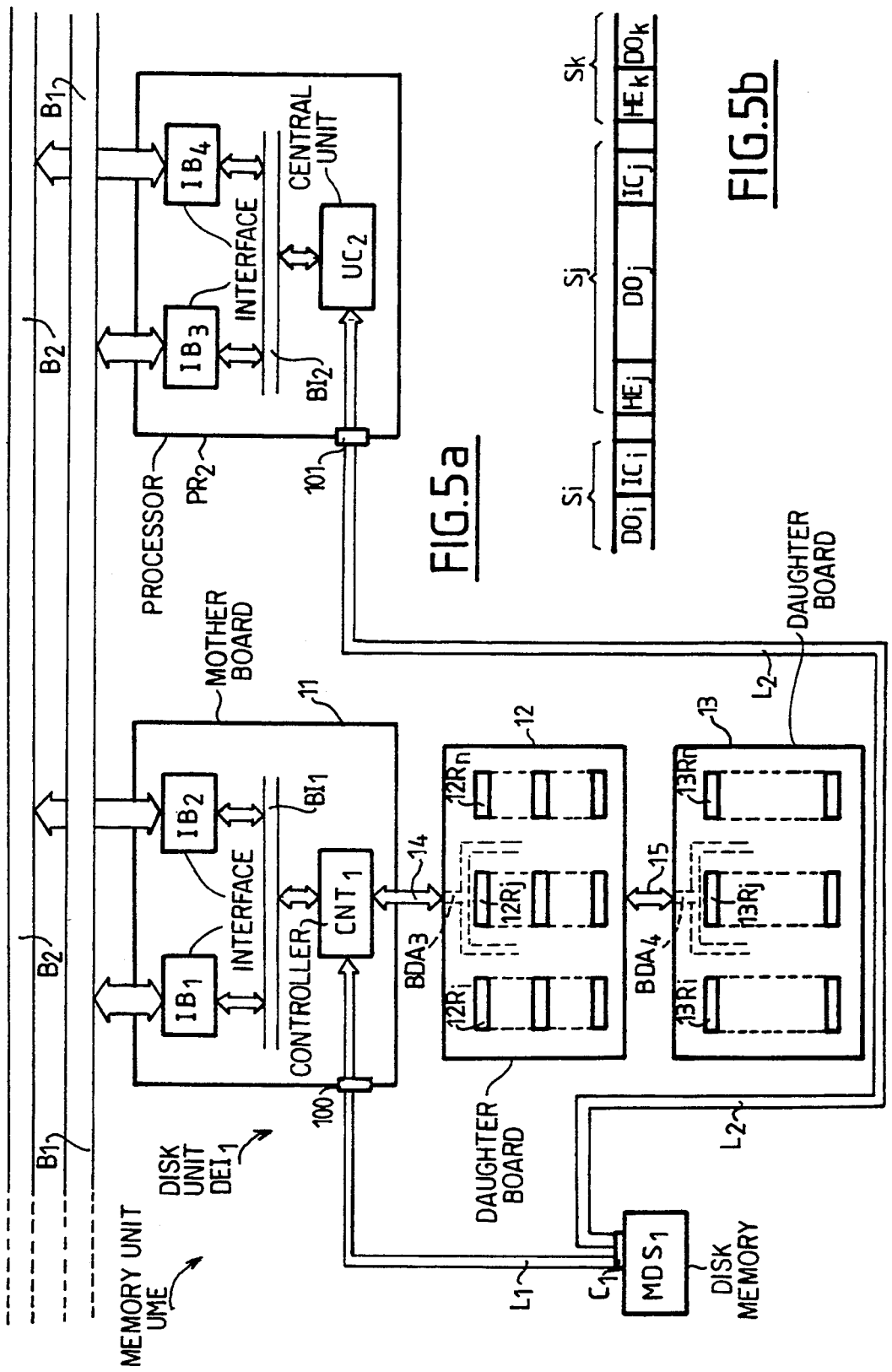

PROTECTED ELECTRONIC MASS MEMORY UNIT INCLUDING FIRST AND SECOND BUSES OF THE PARALLEL TYPE

BACKGROUND OF THE INVENTION

The present invention relates to a protected electronic mass memory unit, the memorizing elements of which comprise semiconductor memories, for instance of the RAM or EEPROM type. More particularly, it is intended to be used as a mass memory subsystem in an information processing system.

An information processing system is known to constitute a central processing unit, embodied by at least one central processor and one main memory to which this processor is connected, various peripheral devices, and an input/output processor assuring the control of the exchange of data between the memory and these various devices.

Peripheral controllers are associated with the various peripheral devices and assure the physical transfer of the data between the central processing unit and the peripherals associated with these various controllers.

All these functional constituent elements of an information processing system are arranged on a set of boards, generally connected to the same parallel bus, that assures the transport of data between the various boards and the electrical supply to them.

The bus, commonly known as Multibus II (registered trademark of Intel Corporation) is one of the buses used most in the industry at present. Its architecture is structured around a main bus of the parallel type, standardized in accordance with IEEE (Institute of Electrical and Electronic Engineers) standard 1296. Since the Multibus II is of the backplane type, the physical structure of an information processing system architecture is accordingly in the form of a board holder rack that holds multiple logic boards; the various physical and mechanical characteristics of the board holder rack are defined by the above standard.

Among the peripherals, mass memories such as rotating magnetic disk memories, are important. Magnetic disk memories are physically separate from the boards forming the information processing system itself and are connected to it by interface cables of the SCSI/IPI type, standardized by the American National Standards Institute (ANSI). Magnetic disk memories are also widely used, because of their low cost per unit of memory capacity (cost per unit of capacity, for example per kilobyte or megabyte).

Nevertheless, these rotating magnetic disk memories have the following disadvantages: They include a large mechanical portion, requiring high precision, and consequently are expensive (requiring a head positioning device for reading information and a motor to make the disk rotate); they are relatively large in volume; and the energy expenditure necessary for the function of the mechanical parts is essentially not insignificant. Finally, the access time for the information is on the order of from 10 to several tens of milliseconds.

The current trend in the industrial development of mass memories is to attempt to obtain better access time and to substantially reduce their physical bulk. To this end, mass memories known as electronic memories or electronic disks, also known as solid state disks, have thus been developed, which use semiconductor memories. Their access time is much less than a millisecond, i.e., several tens of times shorter than the access time of the most powerful rotating disk memories, and they have no rotating parts. The unit memory capacity cost of such electronic memories is still high, about 20 times higher than that of magnetic disk memories. However, the unit memory capacity cost of electronic memories has a tendency to decrease much faster than that of rotating magnetic disk memories, and it is conceivable that the cost will be about the same within a few years.

Electronic disk memories of this kind are currently made by the following manufacturers: Imperial Technology, Inc., 831 South Douglas Street, E1 Segundo, Calif. (its product is known as Megaram); and National Advanced Systems (with its memory unit 7990). Their memory capacity is on the order of several tens of megabytes, and their access time is several tenths of a millisecond. Their output is extremely high, on the order of several megabits per second.

Turning now to FIG. 1, an electronic disk DEA of this kind, known in the prior art, as manufactured by one of the aforementioned companies, is shown.

Such an electronic disk is parallelepiped in shape. It includes a plurality of logic boards 1-5, of which only the board 3 is shown, to make FIGS. 1A and 1B simpler. These various logic boards are parallel to one another and include a plurality of columns of semiconductor memories, for instance of the RAM type. These columns, which are n in number, are identified respectively by the symbols $R_1 \ldots R_j, \ldots R_n$ (in FIG. 1B, $n=4$, and four columns $R_1, R_2, R_3, R_4$ are shown). The information is written inside the various RAMs comprising the various columns $C_1-C_n$, such a way that the blocks of information are successively written at successive addresses, in a manner similar to that conventionally used to write data into RAM memories.

The electronic disk DEA also includes two connectors 6 and 7, visible in the rear portion of the box, enabling connection either with other electronic disks of the same type or with the peripheral controller associated with these various electronic disks, by way of interface cables 8 and 9. These cables 8 an 9 are cables of the SCSI/IPI type, standardized by ANSI. It can be seen that the electronic disks of the DEA type are connected to one another and to their controller by means of interface connections of the same type as those used for rotating disk memories. This analogy in terms of connection with that of rotating disk memories has led those skilled in the art to call the electronic memory units electronic disks, even though the physical shape of the electronic memories is clearly not comparable with the physical shape of rotating magnetic disks.

The information (data and addresses where these data are located within RAM) originating from or proceeding to the RAM memories is carried over a bus BDA. This bus actually comprises one data bus and one address bus (for simplification in FIG. 1B, both these buses have been represented by a single bus). The bus BDA is subdivided in terms of the RAM columns into two branches $BDA_1$ supplying the column $R_1$ and $R_2$, and $BDA_2$ supplying the columns $R_3$ and $R_4$.

It will be noted that the physical bulk of the electronic disks such as DEA is equivalent to that of the rotating magnetic disk memories. Moreover, although the access time to the information contained in any one of the boards of an electronic disk is on the order of several tenths of a millisecond, the fact that the information is sent from a controller to an electronic disk or vice versa via interface links of the type such as links 8 and 9 considerably increases the access time, by on the order of from 1 to 2 milliseconds.

The present invention makes it possible to overcome these disadvantages by providing that the memory plane or planes of the electronic disk function (boards such as 1–5) are no longer disposed at a distance from the controller and processors of the information processing system, as in a conventional rotating magnetic disk memory or electronic disk of the prior art type (passing through the same type of interface link), but instead actually inside a compact assembly that combines the memory planes of the electronic disk units, its controller or controllers, and some of the processors of the information processing system to which the subsystem including the electronic disk units belongs. This compact assembly preferably takes the form of a board holder rack.

According to the invention, the electronic mass memory unit, the various elements of which comprise a plurality of boards each embodied by printed circuits carrying a plurality of semiconductor memories connected to a peripheral controller of the information processing system to which the unit belongs, is characterized in that it includes at least one central processor and one electronic disk unit including a motherboard containing the controller of the unit and a plurality of daughter boards comprising as many memory planes connected to one another 2 by 2, the first of them being connected to the motherboard, the central processor and the electronic disk unit by way of its motherboard being connected to a first and a second bus of the parallel type assuring the transport of information and electrical energy among the boards connected to it, the unit thus being accessible both via its own controller and via the central processor by way of the two buses.

In a preferred embodiment of the invention, the electronic mass memory unit has the particular feature that the two buses are identical and parallel to one another and have a overlap zone between them, to which the motherboard of the electronic disk unit and the central processor are connected. Preferably, the overlap zone is divided into two parts, each capable of receiving at least one electronic disk unit, each of the two parts being supplied with electrical energy by a supply that is separate item the supply to the other part.

To increase the security of access to the information memorized in the electronic memory unit of the invention, this electronic memory unit includes at least one backup rotating disk memory unit connected to the controller of the electronic disk unit and the central processor. Embodied in this way, the memory unit of the invention comprises a subsystem that belongs to a larger information processing system.

Further characteristics and advantages of the present invention will become more apparent from the ensuing detailed description of exemplary embodiments, referring to the accompanying drawings.

BRIEF DESCRIPTION OF THE DRAWINGS

In the drawings:

FIG. 1, including

FIG. 3, including

FIG. 5, including FIGS. 5a and 5b, shows the functional structure in greater detail for the electronic memory unit of the invention shown in FIG. 3A.

DESCRIPTION OF THE PREFERRED EMBODIMENT

Figure 2:
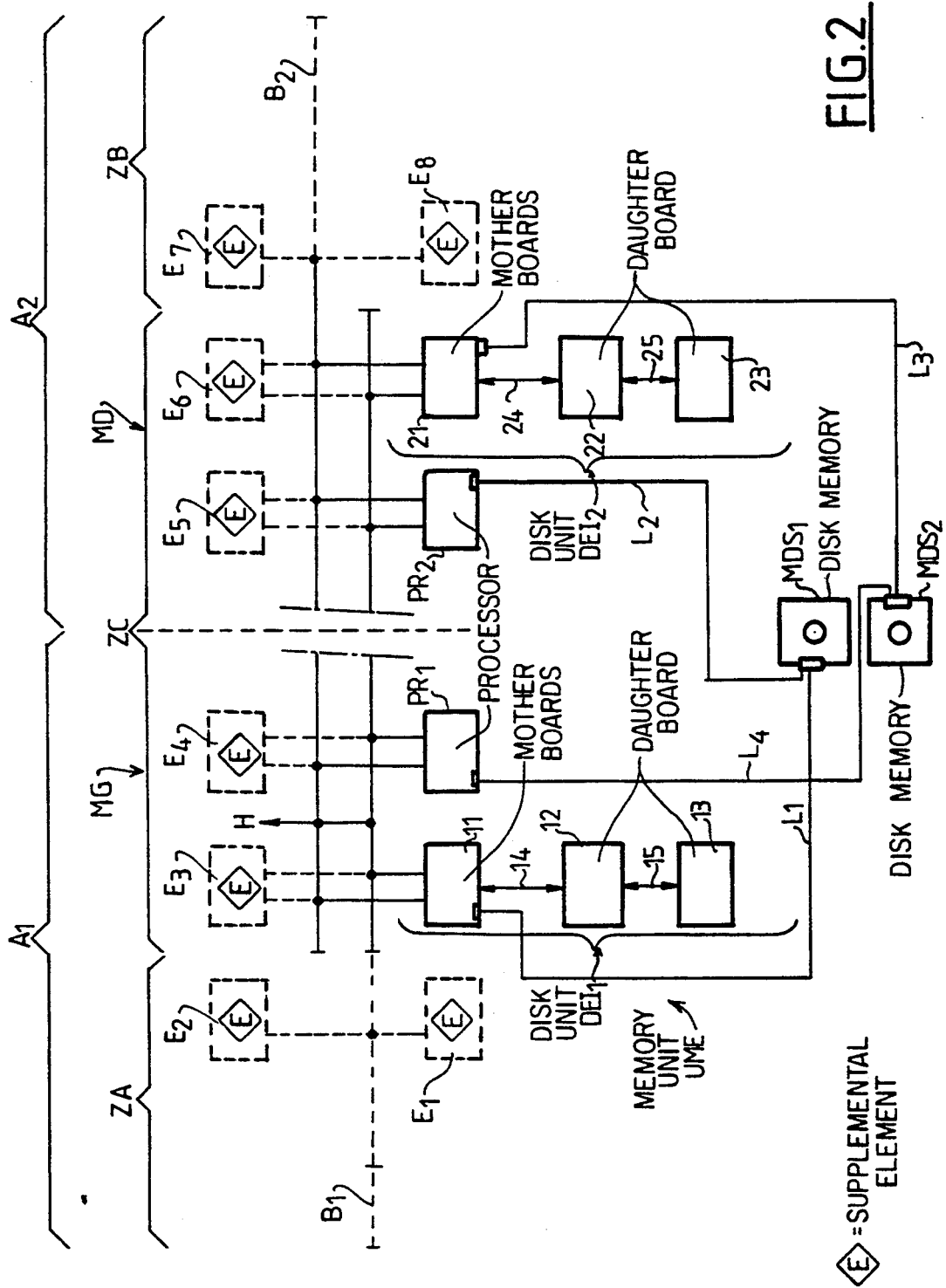
FIG. 2 is a simplified electric wiring diagram for an electronic memory unit according to the invention, including two buses of the Multibus II type and two electronic disk units connected to these two buses.

Turning now to FIG. 2, the electronic memory unit UME according to the invention is shown.

The unit UME can be considered a mass memory information processing subsystem that belongs to a larger information processing system, the central portion of which is commonly known as a host system H.

The unit UME includes two parts MG and MD. Each of these parts is supplied with electrical energy by two separate supply means $A_1$ and $A_2$.

It is structured around two identical buses, parallel to one another, preferably of the Multibus II type and identified as $B_1$ and $B_2$.

The two buses $B_1$ and $B_2$ may either be located fully facing one another, or may include three different zones, which are:

one common zone ZC where the two buses face one another physically;

two zones ZA and ZB where the two buses do not face one another.

Hence it can be said that depending on the case, the two buses $B_1$ and $B_2$ may overlap totally or partially. The unit UME includes an electronic disk unit $DEI_1$ and a central processor $PR_1$ in its first part MG, and a second electronic disk unit $DEI_2$ and a central processor $PR_2$ in its second part MD.

The electronic disk units $DEI_1$ and $DEI_2$ and the processors $PR_1$ and $PR_2$ are connected each to the two buses $B_1$ and $B_2$, in the common overlap zone ZC. Preferably, the electronic memory unit UME is connected to the host system H in this common zone ZC, as can be seen in FIG. 2 (in the part MG, between the processor $PR_1$ and the first electronic disk unit $DEI_1$).

The electronic memory unit UME can also include supplementary constituent elements $E_3$ and $E_4$ in its part MG and supplementary elements $E_5$ and $E_6$ in its part MD. The elements $E_3$, $E_4$, $E_5$, $E_6$ are also connected in the common zone ZC, to both of the two buses $B_1$ and $B_2$. The elements $E_3$ and $E_4$ may for example be a different central processor and a different electronic disk unit, respectively; the same is true for the element $E_6$ and $E_5$.

The number of elements of the units UME depends on the memory capacity assigned to that unit, and also on how important the availability of the system is considered to be.

It is clear that in the case where the overlap zone ZC is only partial, it is possible in zones ZA and ZB to connect other elements, such as $E_1$ and $E_2$ in the first of these zones, and $E_7$ and $E_8$ in the second. The elements $E_1$, $E_2$, $E_7$, $E_8$ are connected to only one of the two buses, that is, $B_1$ for $E_1$ and $E_2$, and $B_2$ for $E_7$ and $E_8$.

In the ensuing description, the unit UME according to the invention will be described in conjunction with FIGS. 3, 4 and 5 in the case where the overlap zone ZC is total, in other words where the two buses $B_1$ and $B_2$ completely face one another, and in conjunction with FIG. 6, in the case where the overlap zone is partial.

The electronic disk units $DEI_1$ and $DEI_2$ respectively include a motherboard 11 and a maximum of two daughter boards 12 and 13 for the first unit, and one motherboard 21 and a maximum of two daughter boards 22 and 23 for the second unit, in the exemplary embodiment shown in FIG. 2. The motherboard 11 is connected to the daughter board 12 via connection means 14, while the daughter board 12 is connected to the daughter board 13 by connection means 15. Similarly, the motherboard 21 is connected to the daughter board 22 by connection means 24, and the two daughter boards 22 and 23 are connected to one another by connection means 25.

The structure of $DEI_1$ and the structure of $DEI_2$ may be different, both in terms of the number of daughter boards (one or two) and the number of RAMs and columns in RAM (and hence in terms of their memory capacity) and in terms of the contents of the information recorded in them.

In order to increase the security of data recording within the various elements comprising the memory unit UME as much as possible (a goal also described as data protection), the memory unit includes a first rotating disk memory for data protection (or backup), identified by the symbol $MDS_1$, connected both to the motherboard 11 via a link $L_1$ and to the processor $PR_2$ via a link $L_2$. Similarly, the unit UME includes a second backup rotating disk memory or $MDS_2$, connected to both the motherboard 21 via a link $L_3$ and the processor $PR_1$ via a link $L_4$. The way in which $MDS_1$ and $MDS_2$ are connected to $L_1$ and $L_2$, $L_3$ and $L_4$, respectively, is illustrated in FIG. 3B to be described below. Each of these links is of the SCSI/IPI type, in other words comprises a set of 25 twisted pairs, at the ends of which 50-point connectors are provided. The need for protecting the data by means of rotating disk memories such as $MDS_1$ and $MDS_2$ derives from the fact that if the semiconductor memories are RAMs, then the data recorded there are lost as soon as there is a loss of electrical power. The data contained within the daughter boards 12 and 13 on the one hand and 22 and 23 on the other are also recorded respectively, for example at the moment when the data are written into the daughter boards, on the circular recording tracks of the rotating magnetic disks of the memories $MDS_1$ and $MDS_2$.

The central processors $PR_1$ and $PR_2$ are the prime contractors of the various elements located in the parts MG and MD, respectively. (In the case where the unit UME includes only a single central processor and only a single electronic disk unit, $PR_2$ and $DE_1$, for example, the processor $PR_2$ is the prime contractor for all the elements located in these parts MG and MD.) The central processors load the implementation programs of the various elements included in the parts MG and MD into them so that they can perform the functions assigned to them. The processors $PR_1$ and $PR_2$ will search for these programs, which are stored in the rotating disk memories $MDS_2$ and $MDS_1$, for example. In this case, these latter memories have a dual function: first, backing up information stored in the units $DEI_1$ and $DEI_2$, and second, storing the aforementioned implementation programs. It will be understood that these programs may be stored in a special disk memory or system disk memory, connected to both the processor $PR_1$ and the processor $PR_2$.

Figure 3A:
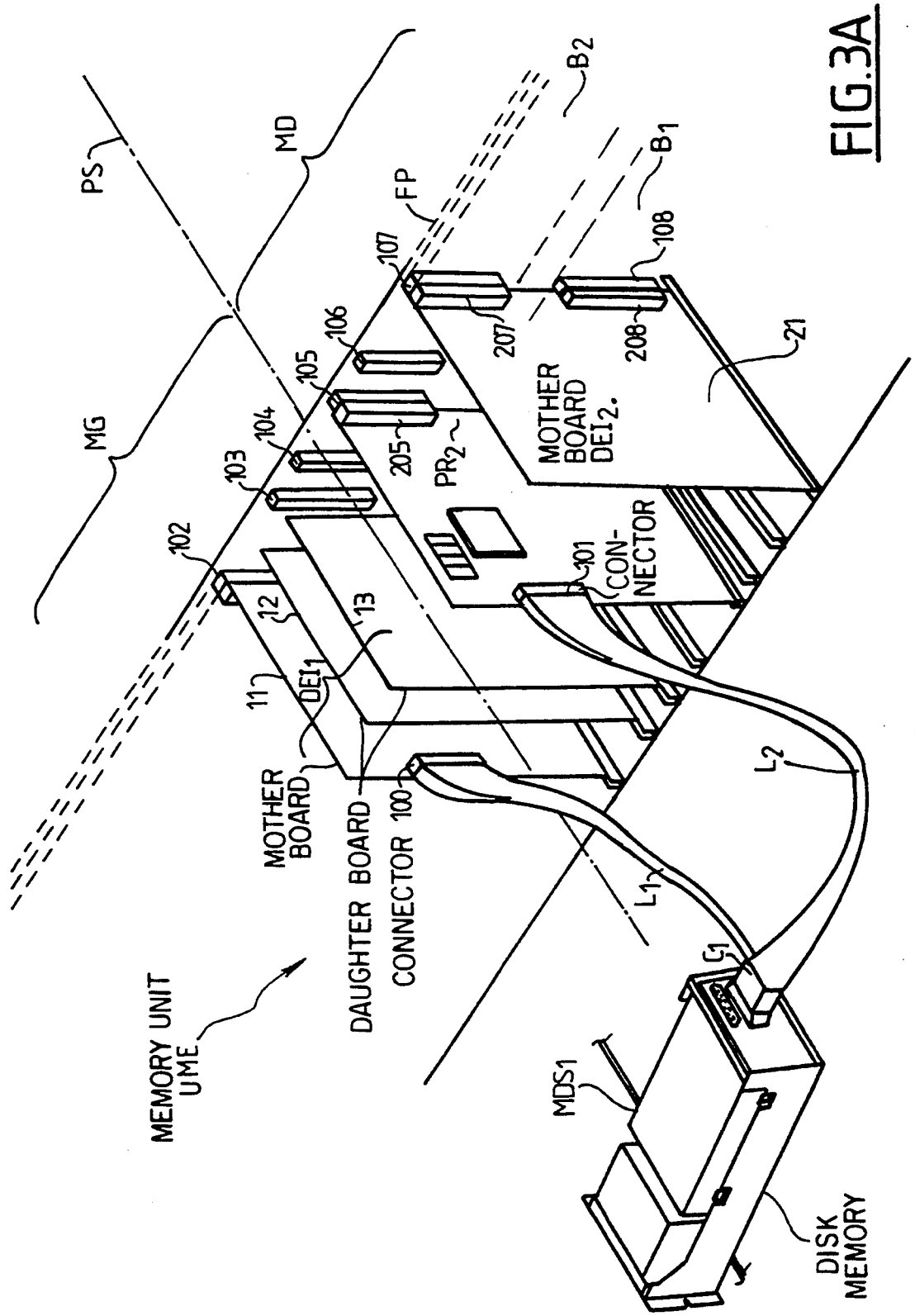
FIGS. 3A and 3B, shows the physical structure in the form of a rack of a two-bus electronic memory unit according to the invention, including a single electronic disk unit, the electric wiring diagram of which is analogous to that of FIG. 2, FIG. 3A being a ¾ perspective view and FIG. 3B showing an example of a connector with which the backup disk memory can be connected to the electronic disk unit and to the central processor.
Figure 4:
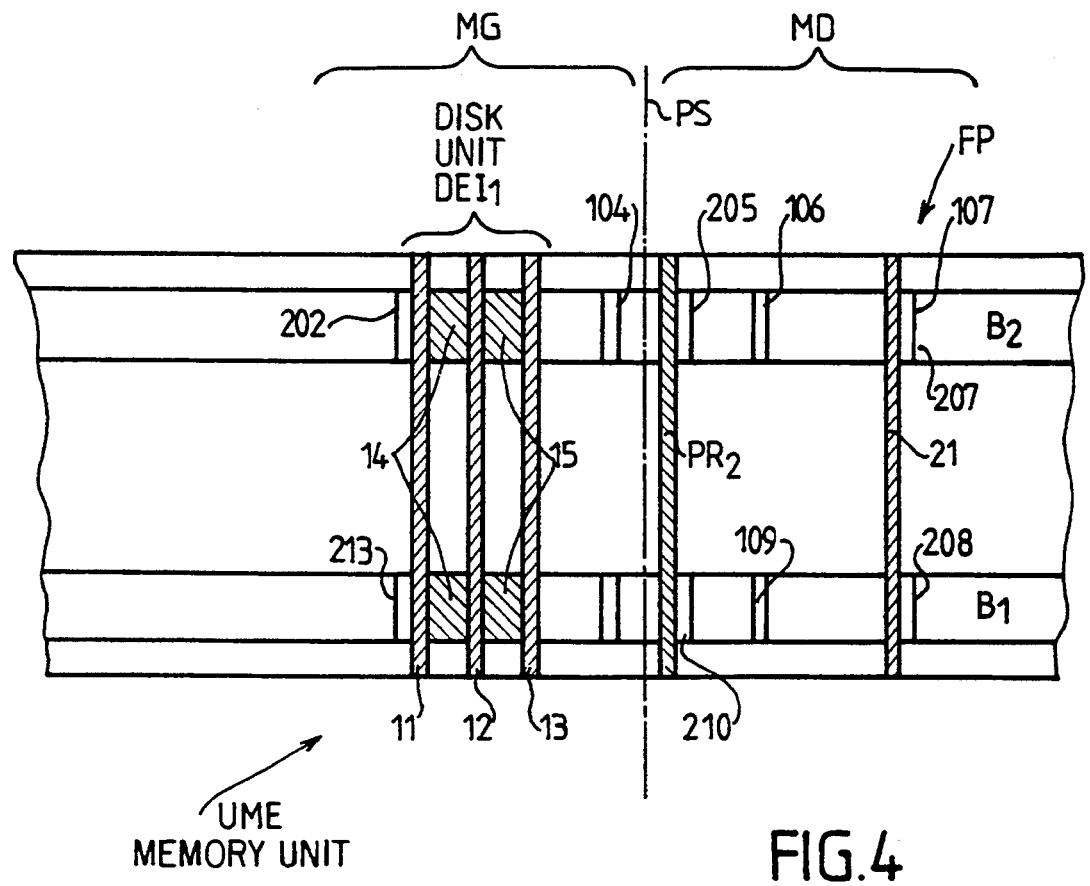
FIG. 4 is a front view of the physical structure shown in FIG. 3A.
Figure 3B:
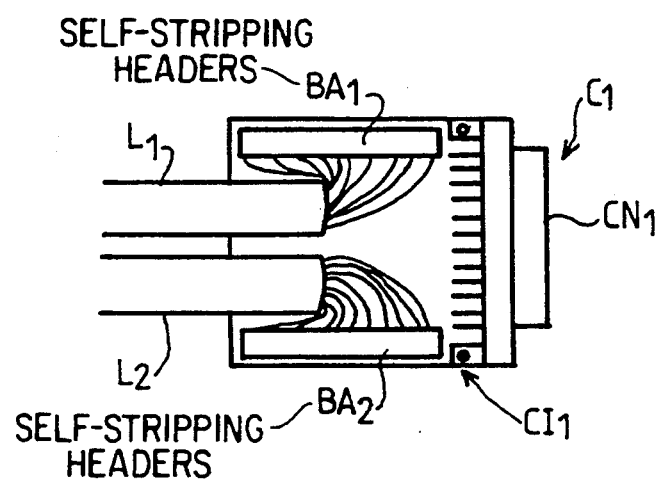

Turning now to FIGS. 3A and 4, a fragmentary view is shown of the backplane FP of the rack containing some of the physical structure of the electronic memory unit UME shown in FIG. 2, specifically the electronic disk unit $DEI_2$ and the processor $PR_2$, along with the motherboard 21 (the associated daughter boards 22 and 23 of which are not shown, to make FIGS. 3A and 4 easier to understand). It will be noted that the electronic memory unit comprises one and the same physical structure, that is, the rack PA, of which for the sake of simplicity only the backplane FP has been shown in FIGS. 3A and 4.

The backplane FP has a plane of symmetry PS perpendicular to its plane and to its long side. Its shape is substantially rectangular and it has a center of symmetry O, which of course is the center of the rectangle.

On either side of the plane of symmetry PS are each of the two parts MG and MD of the memory unit UME. The bus $B_2$ is disposed in the upper part of the backplane FP in FIGS. 3A and 4, while the bus $B_1$ is disposed in its lower part.

In these figures, the backplane FP is shown including six female connectors 102–107 in its upper part, from left to right, and six female connectors 108–113 from left to right in its lower portion (in FIG. 3A, only the connector 108 is visible). The connectors 102–107 are connected electrically to the bus $B_2$, while the connectors 108–113 are connected electrically to the bus $B_1$. These connectors are 96-pin models (with three parallel rows of 32 pins each), in accordance with the standards defined by the International Electromechanical Commission under classification 603-2 IEC 096. The male connectors corresponding to each of these female connectors are naturally defined by the same standard. The plane of symmetry PS passes between the connectors 104 and 105 and between the connectors 110 and 111.

The electronic disk unit $DEI_1$ is connected to the two buses $B_2$ and $B_1$ via two male connectors 202 and 213 corresponding to the female connectors 102 and 113 of the same buses. Only the motherboard 11 is connected to the two buses $B_2$ and $B_1$. Hence it carries the two connectors 202 and 213. The two daughter boards, as has already been mentioned above, are connected to one another by connection means, and the daughter board 12 is connected to the motherboard 11 by connection means 14.

The connection means 14, 15, 24, 25 are made by connecting 160-point male and female connectors; each daughter board has one male connector and one female connector respectively on each of its faces.

The necessary spacing apart from the assembly comprising the motherboard 11 and daughter boards 12-13 is equal to twice the standardized spacing between two adjacent boards connected directly to two buses $B_1$ and $B_2$, hence $2 \times 20.32$ mm = 40.64 mm.

The daughter boards have no connector enabling them to be directly connected to the two buses $B_2$ and $B_1$. The male connectors 202–207 and 208–213 are of the same type, that is $P_1$, standardized by the aforementioned IEEE standard 1296. The disk unit $DEI_2$, of which only the motherboard 21 is shown, is connected to the buses $B_2$ and $B_1$ via the male connectors 207 and 208 and female connectors 107 and 108. The two daughter boards 22 and 23, which are not shown in FIGS. 3A and 4, are in fact disposed to the left of the motherboard 21, in the space located between the connectors 106 and 107. The processor $PR_1$, again not shown for the sake of clarity in FIGS. 3A and 4, is in fact connected to the connectors 104 and 111 and hence is located between the processor $P_2$ and the daughter board 13, in the left-hand part MG.

The motherboard 11 is connected to the link $L_1$, for example by way of the 50-point connector 100 (ANSI standard). The connector 100 is mounted in the rear portion of the board 11 (opposite the portion of this board that includes the connectors connecting it to the buses $B_1$ and $B_2$). Similarly, the link $L_2$ is connected to the processor $PR_2$ by way of the connector 101, which is identical to 100, and is disposed on the corresponding board in the same way, in its rear portion.

FIG. 3B shows an embodiment of the connector $C_1$ that makes it possible to connect the two links $L_1$ and $L_2$ together. $C_1$ is a male connector, for example, that is inserted into a corresponding female connector located in the rear portion of the package containing the backup disk memory $MDS_1$. The connector $C_1$ is shown in its portion located inside a connection package (not shown). One such connector $C_1$ includes a printed circuit $CI_1$ of square or rectangular form, two self-stripping headers $BA_1$ and $BA_2$ which are parallel to one another and soldered to $CI_1$, such as type 8603 made by Souriau, and a connector $CN_1$, for example of the subD type (for example made by 3M, AMP, Ansley, etc.).

The ends of the 50 wires of the twisted pairs respectively comprising the links $L_1$ and $L_2$ are inserted into the headers $BA_1$ and $BA_2$. It is understood that it is the printed circuit itself, by way of its internal conductors, that assures the electrical connection between the ends of the 50 wires comprising the cables 11 and 12 and the 50 points of the connector $CN_1$, which is soldered to one of the ends of the printed circuit $CI_1$. Thus as can be seen in FIG. 3B, the length of the connector $CN_1$ is equal to the dimension of the side of the printed circuit $CI_1$, if the printed circuit is square, or its width, if it is rectangular. The two self-stripping headers $BA_1$ and $BA_2$ are disposed on the side of the printed circuit perpendicular to the length of the connector $CN_1$. In other words, the two self-stripping headers are parallel to the sides of the square comprising the printed circuit $CI_1$, and these sides are horizontal in FIG. 3B.

It will be understood that the set of female connectors 102–107 and the set 108–113 have axes of symmetry that are parallel to one another and to the length of the backplane FP. Moreover, each connector of the set 102–107 and each corresponding connector of the set 108–113 has the same vertical axis of symmetry parallel to the small dimension of the backplane (the width of the rectangle comprising it). It is understood that these relative dispositions of the connectors of each of the two sets 102–107, 108–113 are indispensible, to enable correct correction of the various boards 11, 12, 13, 21, 22, 23, $CR_1$ and $CR_2$ to the inside of the rack PA.

The set of boards located in part MD of the unit UME is seen from the side of the boards that includes the integrated components of these boards, while the set of boards located in part MG is seen from the opposite side from that containing the integrated components, in other words the soldered side. This is because the boards located in part MD are mounted in reverse of the boards located in part MG. Thus the boards 11, 12, 13, $PR_1$ are respectively symmetrical to the boards 21, 22, 23, $PR_2$ with respect to both the plane of symmetry PS and the center of symmetry O of the backplane FP.

The relative disposition of the boards of parts MD and MG means that it is impossible to insert the board in the wrong direction. Hence only one board such as 21 can be inserted into part MG and only one board such as 11 can be inserted into part MD. This is because of the disposition of the connectors on the boards. In fact, looking at the backplane, it is seen that the connectors of the boards located in part MD are on the right of the boards, while the connectors of the boards located in part MG are on the left of the boards. Thus inserting a board that should normally go into part MD into MG instead, and vice versa, would have the effect that the connectors of the boards would abut against the connectors of an adjacent board, preventing the board from being inserted farther into the rack, and thus making its connection impossible.

The description will now refer to FIG. 5a.

The motherboard 11 includes in particular an interface $IB_1$ for communication with the bus $B_1$, an interface $IB_2$ for communication with the bus $B_2$, and a controller $CNT_1$ of the electronic disk unit $DEI_1$; these various elements, that is, $IB_1$ and $IB_2$, $CNT_1$ exchange information via the internal bus $VI_1$ of the motherboard 11.

Figure 1A:
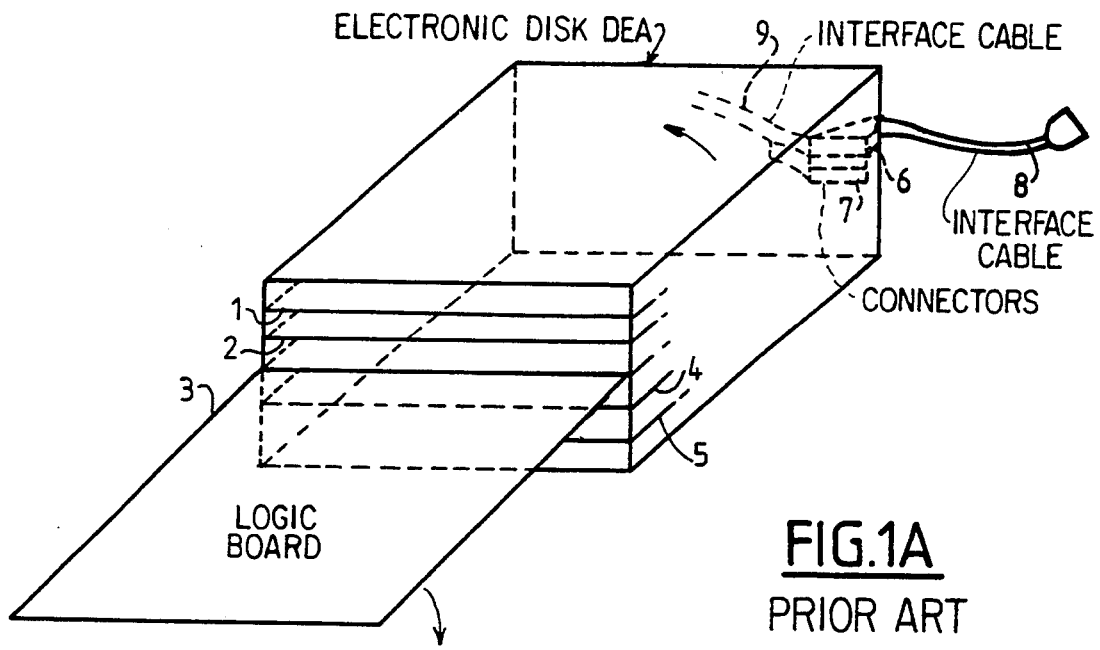
FIGS. 1A and 1B, shows an electronic disk unit according to the prior art.
Figure 1B:
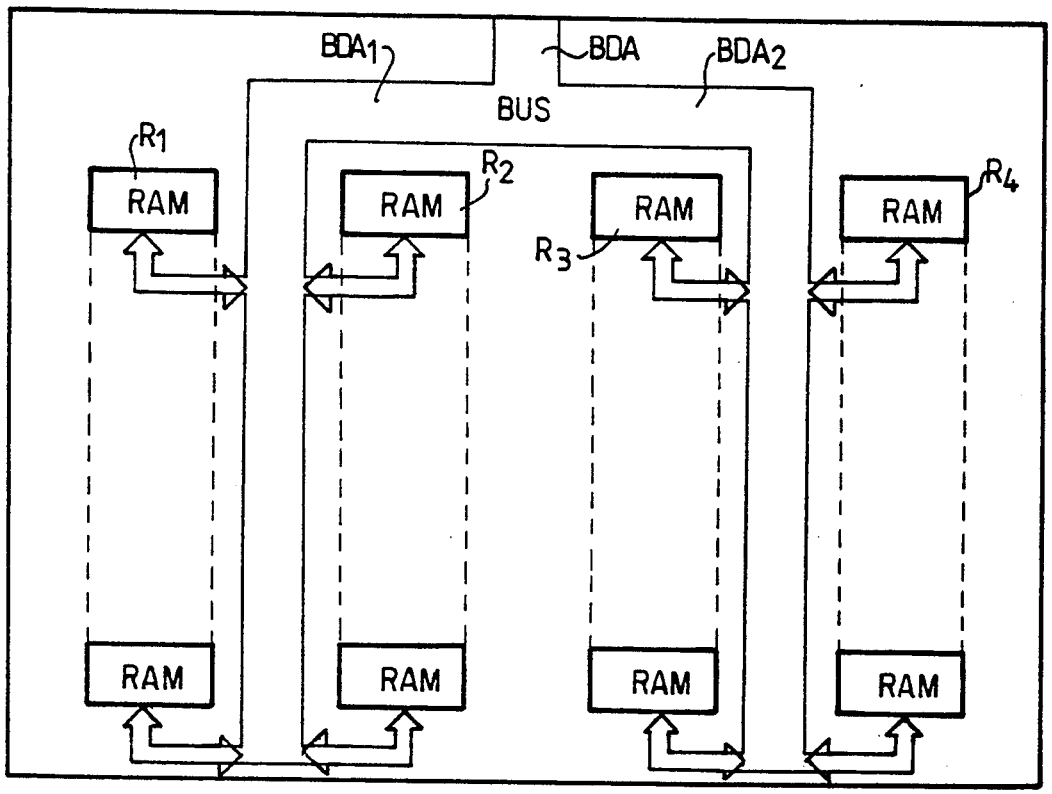

The daughter board 12, which comprises a first memory plane, includes a plurality of RAM memory columns, for example the columns 12 $R_1, \ldots$ 12 $R_j, \ldots$ 12 $R_n$. Similarly, the daughter board 13, which comprises a second memory plane in the electronic disk unit DEI, includes a plurality of semiconductor RAM memory columns, that is, 13 $R_1, \ldots$ 13 $R_j, \ldots$ 13 $R_n$. The internal structure of the boards 12 and 13 is identical to that described for the board 3 of FIG. 1.

The central processor $PR_2$ includes two interfaces for communication with the buses $B_1$ and $B_2$, respectively, that is, $IB_3$ and $IB_4$, a communication bus $BI_2$, and a central unit $UC_2$.

Thus it can be seen that the electronic disk unit $DE_{11}$ is accessible via the central unit of the processor $PR_2$.

The interfaces $IB_1$, $IB_2$, $IB_3$, $IB_4$ are of the same type and in accordance with IEEE standard 1296 comprise a coprocessor, for example of the type VL 82c389 (made by Intel), which communicate by message mode with the other constituent functional elements of the electronic memory unit UME and the host system H.

When the host system H or the processor $PR_2$ wishes to inscribe information into the electronic disk unit $DEI_1$, the information passes over one of the two buses $B_1$ or $B_2$, via the interface between $IB_1$ ($IB_2$) before being sent to the controller $CNT_1$. As a function of the areas available in the memory planes of the daughter boards 12 and 13, the controller inscribes the information there. At the same time, it sends the same information to the backup disk memory $MDS_1$ via the connectors 100 and $C_1$ and the link $L_1$. This same information is inscribed there on one or more circular tracks of one of the magnetic disks of this memory. It will be appreciated that writing of the information in the memory planes of the daughter boards 12 and 13, on the one hand, and on one of the tracks of one of the disks of the backup disk memory MDS on the other does not occur at precisely the same moment, since the access time to the semiconductor memories and to the rotating disks is not the same. Consequently this information will be written on one of the magnetic disks of the backup disk memory $MDS_1$ with a certain delay, because of the longer access time, compared with the moment when the information is written into the memory planes of the daughter boards 12 and 13.

It is understood that the above description for the unit DEI$_1$ is equally applicable to the unit DEI$_2$.

With respect to reading of the information, this is done directly in the memory planes of the daughter boards 12 and 13, with extremely short access times, on the order of several tenths of a millisecond, under the control of the controller CNT$_1$.

FIG. 5b shows the form in which the data are recorded in the boards 12 and 13. The data are divided into a plurality of blocks or sectors S$_i$, S$_j$, S$_k$ containing the same number of bytes. In each sector S$_j$, a header HE$_j$, a data block DO$_j$, and a footer IC$_j$ can be written (or read) successively. The information set of one sector is inscribed in the memory locations the addresses of which are in succession, for example in one unit. For example, a sector S$_i$ will be written at the addresses 301, 302, ..., 350; the sector S$_j$ will be written at the addresses 351–400, and so forth. The header contains the addresses of the beginning and end of recording of the sector S$_j$, and the footer includes the information for verification of the integrity of the data, to verify whether all the recorded bytes of the sector S$_j$ are correct.

The data are written in a 39-bit format, in other words 32 useful bits distributed in four bytes, added to 7 ECC (error correction code) bits. (This error correction mode is conventionally used in dynamic RAM memories.) Hence 39 bits are written at each address of a RAM memory. Consequently, the buses BDA$_3$ and BDA$_4$ of the daughter boards 12 and 13 that carry the information originating from or proceeding to them (these buses play a role similar to that of the bus BDA of FIG. 1) in fact comprise one 39-bit data bus and one address bus.

The data for verifying the integrity of the data in the footer are commonly known as CKS, for check sum, and they represent the mathematical logical sum of all the 32-byte words contained in the part DO$_i$ of the sector S$_i$. In reading, the sum of the bytes read in DO$_i$ is recalculated (either by the controller CNT$_1$ or by the host system, for example) and compared with the CKS value read.

This organization for writing information by sector and distributing the information within the sectors (header, data, footer with CKS) is taken from the organization of information within the circular magnetic tracks of the rotating disks of a conventional disk memory; it enables writing and reading the information with the greatest possible security (or in other words it enables protection of all the data):

1) by protection against errors in data content, because of the presence of the 7 error correction bits ECC per 4 bytes;
2) by protection against addressing errors:
   by verification in reading of the header (which contains the addresses of the beginning and end of recording of the sector in question);
   by verification in reading of the contents of the footer.

If writing of information in the memory planes of boards :12 and 13 is commanded, acknowledgement by the controller CNT$_1$ of a writing command to the host system H (to the central processor) may be done in two ways:

when recording of the information has been done in the corresponding memory plane, without waiting until it has been completely recorded on one of the magnetic disks of the backup disk memory MDS; then the data recording is performed not only in the memory planes of the boards 12 and 13 but also on one of the magnetic disks of the backup memory MDS$_1$: The loss in performance from the standpoint of access time is not as important as might be thought, because the magnetic disk is used only for writing operations, which on average represent only 20 to 40% of the input/output operations of the electronic memory unit UME.

Thus regardless of the acknowledgement system used, the inscription of the information already written in the memory planes onto the backup disk memory is updated systematically upon each writing operation. This system has by far better guarantees of data protection than those frequently employed in current practice, which involve writing data in the backup disk memory only if there is an interruption in electrical power; it will be recalled that this backup method is used when the problem of data volatility associated with the use of RAM-type semiconductor memories is overcome by connecting them to a set of batteries. (This is true for the electronic memories of the prior art described above.)

The other advantage of the mass memory subsystem UME of the invention is the ability to provide supplementary protection: In effect, the specifically backup magnetic disk memory is accessible by the processor PR$_2$ as well, because of the link L$_2$. This access to the backup memory MDS$_1$ is used only in the case of failure of the motherboard 11, or in the case of total or partial failure of the memory plane of the daughter boards 12 and 13. Hence it will be seen that in the event of a complete failure of the controller CNT$_1$ or of interruptions in the supply voltage to it, access by the processor PR$_2$ allows the host system H to have the access to the data normally gained by the controller CNT$_1$, although in that event the performance is somewhat less because of the longer access time.

Hence the advantages of the invention are clear: high availability, due to the dual access to the data contained in each of the electronic disk units DEI$_1$ and DEI$_2$ over the two buses B$_1$ and B$_2$, and strong data protection, due both to the presence of the backup disk memory, which is accessible both from CNT$_1$ and from PR$_2$ (this backup memory accordingly also has dual access), and the organization of writing of information into the RAM memories copied from that of rotating disk memories.

Additionally, the electronic memory unit according to the invention has major advantages because of its small bulk, its very short access time, and its low cost compared with the electronic memory units of the prior art.

Figure 6:
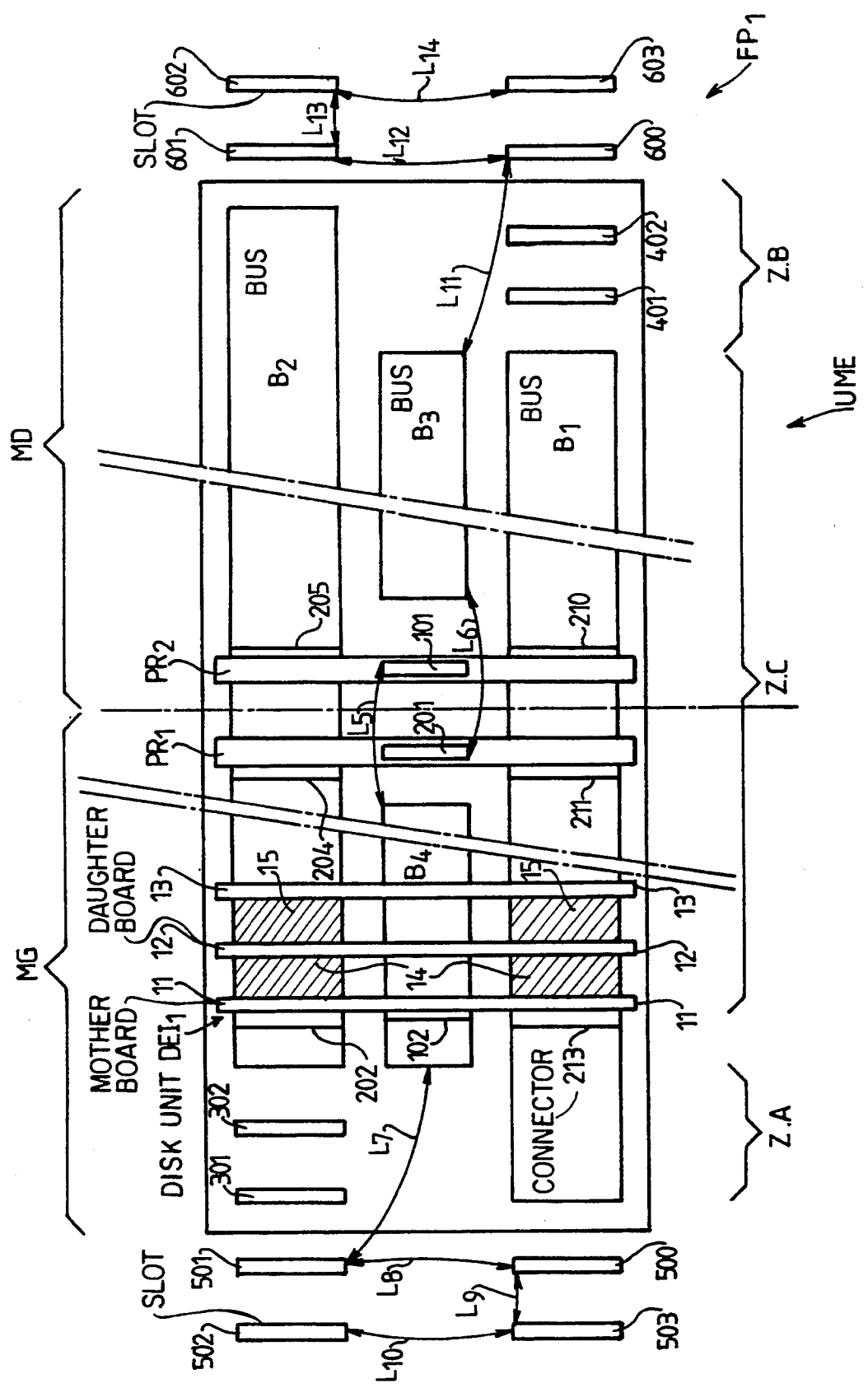
FIG. 6 shows a second exemplary embodiment of a physical structure of an electronic memory unit including a single electronic disk unit, the electrical wiring diagram of which is analogous to that of FIG. 2.

Turning now to FIG. 6, another exemplary embodiment of an electronic memory unit UME according to the invention is shown.

This unit is represented with its backplane FP$_1$, which includes two parallel buses of the Multibus II type, B$_1$ and B$_2$, disposed in the lower and upper part, respectively, of the backplane, parallel to and offset from one another in such a way that they have one zone of common overlap ZC, which in the exemplary embodiment described here includes 16 connectors, and two zones ZA and ZB', which include two connectors. In the extension of the bus B$_2$, the backplane FP$_1$ has two connectors 301 and 302, which for example are identical to the connectors of the bus $B_2$ (that is, 102-107; see FIG. 3a) and having the same spacing. In the same manner, the backplane $FP_2$ has two connectors 401 and 402 in the extension of the bus $B_1$, which are identical to the connector of the bus $B_1$ and has the same spacing. The total number of connectors of the backplane $FP_1$ is accordingly 20.

In FIG. 6, the electronic disk unit $DEI_1$ is shown, including the motherboard 11 and the daughter boards 12 and 13; the connection means 14 and 15; and the connectors 202 and 213, disposed in the left part MG of the unit UME; and the processor $PR_1$, also disposed in this left part MG and connected to the two buses $B_2$ and $B_1$ via the connectors 204 and 211. The processor $PR_2$ is also shown, disposed in the right part MD and connected to the buses $B_2$ and $B_1$ via the connectors 205 and 210. The processor $PR_2$ is shown provided with its connector 101 enabling its connection to a link of the 50 point twisted pair SCSI type. Similarly, the processor $PR_1$ is shown with its connector 201, which is identical to 101.

The backplane $FP_1$ also includes two buses $B_3$ and $B_4$ of the SCSI type, that is, including 50 points or in other words carrying 50 signals (hence these are buses disposed on the printed circuit), of the same length and enabling the connection of the various component elements of the electronic memory unit UME to backup disk memories. The processor $PR_2$ is connected to the connector 101 and to the bus $B_4$ by way of a 50 point SCSI differential filamentary link $L_5$ (the link $L_5$ is of course assumed here to be provided with a 50-point connector at both ends enabling its connection to the bus $B_4$ and to the connector 101).

Similarly, the main processor $PR_1$ is connected by way of the SCSI-type link $L_6$ to the bus $B_3$ and to the connector 201. The electronic disk unit $DEI_1$ is connected to the bus $B_4$ by way of the connector 102.

In a preferred embodiment of the electronic memory unit UME according to the invention as shown in FIG. 6, four slots may be disposed on either side of the backplane $FP_1$ for $3\frac{1}{2}''$ insertable rotating disk memories; these disk memories are increasingly widely available on the market. To the left of the backplane $FP_1$, the four slots 500-503 are found, capable of receiving four $3\frac{1}{2}''$ disk memories, while the four slots 600-603 are seen on the right of the same backplane.

The bus $B_4$ is connected to the slot 501 by way of a 50-point link $L_7$, while the bus $B_3$ is connected to the slot 600 by a 50-point link $L_{11}$. When the slots 500-503 on the one hand and 600-603 on the other are provided with their $3\frac{1}{2}''$ disk memories, they are connected by a 50-point link, such as $L_8$, between the slots 501 and 500, $L_9$ between 500 and 503, $L_{10}$ between 503 and 502, on the one hand, and $L_{12}$ between 600 and 601, $L_{13}$ between 601 and 602, and $L_{14}$ between 602 and 603. The connectors that enable connecting the various links $L_7$ through $L_{10}$ on the one hand and $L_{11}$-$L_{14}$ on the other to the various $3\frac{1}{2}''$ disk memories are connectors of the kind shown in FIG. 3B.

The $3\frac{1}{2}''$ disk memories that can be disposed in the slots 500-503 and 600-603 can constitute backup disk memories; the arrangement may be that the disk memories disposed in slots 500-503 are assigned only to the electronic disk unit $DEI_1$, or the disk memory units disposed in slots 600-603 may be assigned only to the electronic disk memory $DEI_2$, or slots 500-503 can be used for backup disk memories of the various electronic disk units connected in the left-hand part MG, and the slots 600-603 for the electronic disk units disposed in the right-hand part MD.

It will be understood that the unit UME shown in FIG. 6 has the same advantages as that shown in the previous drawing figure; it is also more compact in terms of bulk, and its performance in terms of access time is even better.

I claim:

1. A protected electronic mass memory unit (UME), including at least one electronic disc unit ($DEI_1$-$DEI_2$), comprising: a controller and at least one central processor ($PR_1$-$PR_2$); a first and second bus ($B_1$-$B_2$) of the parallel type, said first and second bus enabling connection of the mass memory unit to at least one host system (H); the central processor ($PR_1$-$PR_2$) and the disc unit ($DEI_1$-$DEI_2$), each being connected to said first and second bus ($B_1$-$B_2$) for making the disc unit accessible to the host system via a controller ($CNT_1$-$CNT_2$) and the central processor ($PR_1$-$PR_2$), wherein:

at least one back-up disc unit ($MDS_1$-$MDS_2$) of a specific type is connected to said controller ($CNT_1$-$CNT_2$) and to the central processor ($PR_1$-$PR_2$), said at least one back-up unit including information strictly identical to information written in the electronic unit;

said first and second buses ($B_1$-$B_2$) being identical and parallel to one another and having an overlap zone (ZC) therebetween, said disc unit and said central processor being connected to said overlap zone;

said electronic mass memory unit further comprising a third and fourth bus ($B_3$-$B_4$), said third and fourth buses being identical and parallel to one another, said third and fourth buses being one of specific type and being disposed between and parallel to said first and second buses;

said mass memory unit having a physical structure in the form of a rack including a back plane wherein said first and second parallel buses are connected to logic boards carrying the disc unit and the central processor, said first and second buses being disposed in a lower and an upper part of said back plane, respectively;

said third and fourth buses being connected on a first side to the central processor, and on a second side to the disc unit; and supplemental elements for the disc unit being connectable to each of the first and second buses outside the overlap zone, and insertable rotating back-up memories being mounted on the back plane and connected to the third bus by a link of a specific type.

2. The memory unit of claim 1, wherein the disk unit ($DEI_1$, $DEI_2$) includes a mother board (11, 21) comprising said controller ($CNT_1$, $CNT_2$) which is connected to said first and second bus on one side and to said third bus on the other side, said disk unit ($DEI_1$, $DEI_2$) further including a set of a semi-conductor memories (11-12-13, 21-22-23) contained in a plurality of daughter boards (12-13, 22-23).

3. The memory unit of claim 2, wherein said plurality of daughter boards (12-13, 22-23) comprise an equal number of memory planes and are connected to one another two by two, a first memory plane being connected to the motherboards, said motherboard being connected to the first and second buses ($B_1$, $B_2$).

4. The memory unit of claim 3, having a physical structure in the form of a rack (PA) with logic boards, including a backplane (FP) of substantially rectangular shape having a center of symmetry (O) and a plane of symmetry (PS) perpendicular to the plane of the backplane and a long dimension thereof, wherein the backplane (FP) carries said first and second buses ($B_1$, $B_2$) and said third bus of the SCSI-type, and further including a first row of connectors (102, 107) of the first bus ($B_1$), all said connectors having the same first axis of symmetry parallel to said long dimension of said backplane, and a second row of connectors (108–113) of the second bus ($B_2$) having a second axis of symmetry parallel to the first axis of symmetry said first and second rows of connectors being aligned two by two in the same line parallel to the width of the backplane.

5. The memory unit of claim 3, wherein organization of distribution of information, both inside said memory planes of the daughter boards (12, 13) and inside circular tracks of rotating disks of the backup memory is done in the form of a plurality of distinct sectors ($S_i$, $S_j$, ...) each including a header ($AG_i$, $AG_j$) containing the address of the beginning and end of the sector, a central portion ($DO_i$, $DO_j$) containing the data per se, and a footer ($IC_i$, $IC_j$) containing the information (CKS) for verifying the integrity of the data.

6. The memory unit of claim 3 further including slots on either side of the backplane ($FP_1$) for 3-½″ insertable disk memories connected to one another via SCSI-type links and also connected to the SCSI-type bus ($B_4$) via a link of the same type.

7. The memory unit of claim 2, having a physical structure in the form of a rack (PA) with logic boards, including a backplane (FP) of substantially rectangular shape having a center of symmetry (O) and a plane of symmetry (PS) perpendicular to the plane of the backplane and a long dimension thereof, wherein the backplane (FP) carries said first and second buses ($B_1$, $B_2$) and said third bus of the SCSI-type, and further including a first row of connectors (102, 107) of the first bus ($B_1$), all said connectors having the same first axis of symmetry parallel to said long dimension of said backplane, and a second row of connectors (108–113) of the second bus ($B_2$) having a second axis of symmetry parallel to the first axis of symmetry said first and second rows of connectors being aligned two by two in the same line parallel to the width of the backplane.

8. The memory unit of claim 2, wherein organization of distribution of information, both inside said memory planes of the daughter boards (12, 13) and inside circular tracks of rotating disks of the backup memory is done in the form of a plurality of distinct sectors ($S_i$, $S_j$, ...) each including a header ($AG_i$, $AG_j$) containing the address of the beginning and end of the sector, a central portion ($DO_i$, $DO_j$) containing the data per se, and a footer ($IC_i$, $IC_j$) containing the information (CKS) for verifying the integrity of the data.

9. The memory unit of claim 2 further including slots on either side of the backplane ($FP_1$) for 3-½″ insertable disk memories connected to one another via SCSI-type links and also connected to the SCSI-type bus ($B_4$) via a link of the same type.

10. The memory unit of claim 1, wherein said overlap zone (ZC) is divided into two parts (MG, MD), each capable of receiving at least one electronic disk unit ($DEI_1$, $DEI_2$), said two parts being supplied with electrical energy by two mutually independent power supplied ($A_1$, $A_2$).

11. The memory unit of claim 10, having a physical structure in the form of a rack (PA) with logic boards, including a backplane (FP) of substantially rectangular shape having a center of symmetry (O) and a plane of symmetry (PS) perpendicular to the plane of the backplane and a long dimension thereof, wherein the backplane (FP) carries said first and second buses ($B_1$, $B_2$) and said third bus of the SCSI-type, and further including a first row of connectors (102, 107) of the first bus ($B_1$), all said connectors having the same first axis of symmetry parallel to said long dimension of said backplane, and a second row of connectors (108–113) of the second bus ($B_2$) having a second axis of symmetry parallel to the first axis of symmetry said first and second rows of connectors being aligned two by two in the same line parallel to the width of the backplane.

12. The memory unit of claim 10, wherein organization of distribution of information, both inside said memory planes of the daughter boards (12, 13) and inside circular tracks of rotating disks of the backup memory is done in the form of a plurality of distinct sectors ($S_1$, $S_j$, ...) each including a header ($AG_i$, $AG_j$) containing the address of the beginning and end of the sector, a central portion ($DO_i$, $DO_j$) containing the data per se, and a footer ($IC_i$, $IC_j$) containing the information (CKS) for verifying the integrity of the data.

13. The memory unit of claim 10 further including slots on either side of the backplane ($FP_1$) for 3-½″ insertable disk memories connected to one another via SCSI-type links and also connected to the SCIS-type bus ($B_4$) via a link of the same type.

14. The memory unit of claim 1, having a physical structure in the form of a rack (PA) with logic boards, including a backplane (FP) of substantially rectangular shape having a center of symmetry (O) and a plane of symmetry (PS perpendicular to the plane of the backplane and a long dimension thereof, wherein the backplane (FP) carries said first and second buses ($B_1$, $B_2$) and said third bus of the SCSI-type, and further including a first row of connectors (102, 107) of the first bus ($B_1$), all said connectors having the same first axis of symmetry parallel to said long dimension of said backplane, and a second row of connectors (108–113) of the second bus ($B_2$) having a second axis of symmetry parallel to the first axis of symmetry said first and second rows of connectors being aligned two by two in the same line parallel to the width of the backplane.

15. The memory unit of claim 14, wherein organization of distribution of information, both inside said memory planes of the daughter boards (12, 13) and inside circular tracks of rotating disks of the backup memory is done in the form of a plurality of distinct seconds ($S_i$, $S_j$, ...) each including a header ($AG_i$, $AG_j$) containing the address of the beginning and end of the sector, a central portion ($DO_i$, $DO_j$) containing the data per se, and a footer ($IC_i$, $IC_j$) containing the information (CKS) for verifying the integrity of the data.

16. The memory unit of claim 14 further including slots on either side of the backplane ($FP_1$) for 3-½″ insertable disk memories connected to one another vis SCSI-type links and also connected to the SCSI-type bus ($B_4$) via a link of the same type.

17. The memory unit of claim 1, having a physical structure in the form of a rack (PA) with logic boards, including a backplane (FP) of substantially rectangular shape having a center of symmetry (O) and a plane of symmetry (PS) perpendicular to the plane of the backplane and a long dimension thereof, wherein the backplane (FP) carries said first and second buses ($B_1$, $B_2$) and said third bus of the SCSI-type, and further including a first row of connectors (102, 107) of the first bus (B$_1$), all said connectors having the same first axis of symmetry parallel to said long dimension of said backplane, and a second row of connectors (108–113) of the second bus (B$_2$) having a second axis of symmetry parallel to the first axis of symmetry said first and second rows of connectors being aligned two by two in the same line parallel to the width of the backplane.

18. The memory unit of claim 1, wherein organization of distribution of information, both inside said memory planes of the daughter boards (12, 13) and inside circular tracks of rotating disks of the backup memory is done in the form of a plurality of distinct sectors (S$_i$, S$_j$, ...) each including a header (AG$_i$, AG$_j$) containing the address of the beginning and end of the sector, a central portion (DO$_i$, DO$_j$) containing the data per se, and a footer (IC$_i$, IC$_j$) containing the information (CKS) for verifying the integrity of the data.

19. The memory unit of claim 1 further including slots on either side of the backplane (FP$_1$) for 3-½" insertable disk memories connected to one another vis SCSI-type links and also connected to the SCSI-type bus (B$_4$) via a link of the same type.

20. The memory unit of claim 1 further including slots on either side of the backplane (FP$_1$) for 3-½" insertable disk memories connected to one another vis SCSI-type links and also connected to the SCSI-type bus (B$_4$) via a link of the same type.

* * * * *

UNITED STATES PATENT AND TRADEMARK OFFICE
CERTIFICATE OF CORRECTION

PATENT NO. : 5,386,535
DATED : January 31, 1995
INVENTOR(S) : Daniel CARTEAU

It is certified that error appears in the above-indentified patent and that said Letters Patent is hereby corrected as shown below:

Column 13, lines 65-66 "supplied" should read -- supplies --.

Column 14, line 28 "SCIS-type" should read -- SCSI-type --.

Column 14, line 34 "(PS" should read -- (PS) --.

Column 14, line 51 "seconds" should read -- sectors --.

Column 14, line 58 "vis" should read -- via --.

UNITED STATES PATENT AND TRADEMARK OFFICE
CERTIFICATE OF CORRECTION

PATENT NO. : 5,386,535
DATED : January 31, 1995
INVENTOR(S) : Daniel CARTEAU

It is certified that error appears in the above-indentified patent and that said Letters Patent is hereby corrected as shown below:

Column 16, line 6 "vis" should read -- via --.

Column 16, line 11 "vis" should read -- via --.

Signed and Sealed this

Sixth Day of June, 1995

Attest:

BRUCE LEHMAN

*Attesting Officer*    *Commissioner of Patents and Trademarks*